United States Patent
Jang et al.

(10) Patent No.: US 12,315,579 B2
(45) Date of Patent: May 27, 2025

(54) MEMORY DEVICE INCLUDING SENSE AMPLIFYING CIRCUIT

(71) Applicant: SK hynix Inc., Icheon-si (KR)

(72) Inventors: Yeonsu Jang, Icheon-si (KR); Woongrae Kim, Icheon-si (KR); Jung Min Yoon, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 217 days.

(21) Appl. No.: 18/333,756

(22) Filed: Jun. 13, 2023

(65) Prior Publication Data

US 2024/0233851 A1 Jul. 11, 2024

(30) Foreign Application Priority Data

Jan. 11, 2023 (KR) .......... 10-2023-0003972

(51) Int. Cl.
| | | |
|---|---|---|
| *G11C 29/12* | (2006.01) | |
| *G11C 29/42* | (2006.01) | |
| *G11C 29/46* | (2006.01) | |
| G11C 7/04 | (2006.01) | |
| G11C 29/44 | (2006.01) | |
| G11C 29/50 | (2006.01) | |

(52) U.S. Cl.
CPC .......... *G11C 29/1201* (2013.01); *G11C 29/42* (2013.01); *G11C 29/46* (2013.01); G11C 7/04 (2013.01); G11C 2029/4402 (2013.01); G11C 29/50 (2013.01); G11C 2029/5002 (2013.01)

(58) Field of Classification Search
CPC ...... G11C 29/1201; G11C 29/42; G11C 29/46
USPC .......................................... 365/201
See application file for complete search history.

(56) References Cited

U.S. PATENT DOCUMENTS

| | | | | |
|---|---|---|---|---|
| 6,011,731 A * | 1/2000 | Beigel | .................. | G11C 29/02 365/201 |
| 6,036,101 A * | 3/2000 | Hass | .................. | G06F 3/04897 374/E3.007 |
| 10,224,086 B2 | 3/2019 | Kim et al. | | |
| 2002/0149972 A1* | 10/2002 | Lamb | .................. | G01R 31/3167 365/189.09 |
| 2010/0165767 A1* | 7/2010 | Lin | .................. | G11C 7/065 365/207 |

(Continued)

FOREIGN PATENT DOCUMENTS

KR 1020160122586 A 10/2016

*Primary Examiner* — Ly D Pham
(74) *Attorney, Agent, or Firm* — IP & T GROUP LLP

(57) ABSTRACT

A memory device includes a sense amplifying circuit coupled between a pull-up voltage line and a pull-down voltage line and configured to sense and amplify data of bit lines according to a sensing control signal; a fail detection circuit configured to calculate counting values of fail bits for each temperature based on the data and configured to generate a minimum error code for each temperature by detecting a minimum value for each temperature from the counting values for each temperature, in response to a test mode signal; and a sense amplifying control circuit configured to drive the pull-up voltage line and the pull-down voltage line by generating a pull-up voltage and a pull-down voltage corresponding to current temperature information based on the minimum error code for each temperature and configured to generate the sensing control signal according to the test mode signal.

19 Claims, 15 Drawing Sheets

(56) References Cited

U.S. PATENT DOCUMENTS

| | | | |
|---|---|---|---|
| 2010/0232242 A1* | 9/2010 | Deng | G11C 29/44 365/201 |
| 2016/0307616 A1* | 10/2016 | Rim | G11C 29/028 |
| 2021/0174845 A1* | 6/2021 | Singh | G11C 11/419 |

* cited by examiner

FIG. 6A

| VSAP(V) | VSAP_CODE<1> | VSAP_CODE<0> |
|---|---|---|
| 1.9 | 0 | 0 |
| 2.0 | 0 | 1 |
| 2.1 | 1 | 0 |
| 2.2 | 1 | 1 |

FIG. 6B

| VSAN(V) | VSAN_CODE<1> | VSAN_CODE<0> |
|---|---|---|
| 1.0 | 0 | 0 |
| 1.1 | 0 | 1 |
| 1.2 | 1 | 0 |
| 1.3 | 1 | 1 |

FIG. 7A

| VSAN(V) | VSAP(V) | Combined CODE | H_FBC |
|---|---|---|---|
| 1.0 | 1.9 | 0000 | 100 |
|  | 2.0 | 0001 | 300 |
|  | 2.1 | 0010 | 400 |
|  | 2.2 | 0011 | 500 |
| 1.1 | 1.9 | 0100 | 600 |
|  | 2.0 | 0101 | 500 |
|  | 2.1 | 0110 | 400 |
|  | 2.2 | 0111 | 1,000 |
| 1.2 | 1.9 | 1000 | 9,000 |
|  | 2.0 | 1001 | 10,000 |
|  | 2.1 | 1010 | 500 |
|  | 2.2 | 1011 | 10,000 |
| 1.3 | 1.9 | 1100 | 800 |
|  | 2.0 | 1101 | 90,000 |
|  | 2.1 | 1110 | 4,000 |
|  | 2.2 | 1111 | 50,000 |

FIG. 7B

| VSAN(V) | VSAP(V) | Combined CODE | C_FBC |
|---|---|---|---|
| 1.0 | 1.9 | 0000 | 80 |
| | 2.0 | 0001 | 300 |
| | 2.1 | 0010 | 400 |
| | 2.2 | 0011 | 500 |
| 1.1 | 1.9 | 0100 | 600 |
| | 2.0 | 0101 | 500 |
| | 2.1 | 0110 | 400 |
| | 2.2 | 0111 | 1,000 |
| 1.2 | 1.9 | 1000 | 9,000 |
| | 2.0 | 1001 | 10,000 |
| | 2.1 | 1010 | 50 |
| | 2.2 | 1011 | 30 |
| 1.3 | 1.9 | 1100 | 80 |
| | 2.0 | 1101 | 90,000 |
| | 2.1 | 1110 | 4,000 |
| | 2.2 | 1111 | 50,000 |

FIG. 9A

| H_MIN_C, C_MIN_C || H_VREFP (V) | C_VREFP (V) | VSAP (V) |
|---|---|---|---|---|
| VSAP_CODE<1> | VSAP_CODE<0> | | | |
| 0 | 0 | 0.8 | 0.9 | 1.9 |
| 0 | 1 | 0.9 | 1 | 2.0 |
| 1 | 0 | 1 | 1.1 | 2.1 |
| 1 | 1 | 1.1 | 1.2 | 2.2 |

FIG. 9B

| H_MIN_C, C_MIN_C || H_VREFN (V) | C_VREFN (V) | VSAN (V) |
|---|---|---|---|---|
| VSAN_CODE<1> | VSAN_CODE<0> | | | |
| 0 | 0 | 0.4 | 0.6 | 1.0 |
| 0 | 1 | 0.5 | 0.7 | 1.1 |
| 1 | 0 | 0.6 | 0.8 | 1.2 |
| 1 | 1 | 0.7 | 0.9 | 1.3 |

MEMORY DEVICE INCLUDING SENSE AMPLIFYING CIRCUIT

CROSS-REFERENCE TO RELATED APPLICATION

The present application claims priority under 35 U.S.C. § 119(a) to Korean Patent Application No. 10-2023-0003972, filed on Jan. 11, 2023, which is incorporated herein by reference in its entirety.

BACKGROUND

1. Field

Various embodiments of the present disclosure relate to a semiconductor design technology, and more particularly, to a memory system including a sense amplifying circuit.

2. Description of the Related Art

A semiconductor memory device has memory cells that store data and includes a sense amplifying circuit that detects and amplifies data in a memory cell to output data stored in the memory cell.

On the other hand, the sensing characteristics of the sense amplifying circuit of each chip differ depending on the distribution by location (i.e., process skew variation) within a wafer. When the sense amplifying circuit is controlled unconditionally and equally based on a specific standard, the chip, which has a sensing characteristic below the standard, may be defective because the sensing ability is unfavorable, which eventually leads to a decrease in yield. Therefore, it is necessary to control the sense amplifying circuit differently according to the sensing characteristics.

SUMMARY

Embodiments of the present disclosure are directed to a memory device capable of driving a sense amplifying circuit at a voltage corresponding to current temperature information based on counting values of fail bits by temperature and a method of operating the same.

According to an embodiment of the present disclosure, a memory device includes: a sense amplifying circuit coupled between a pull-up voltage line and a pull-down voltage line and configured to sense and amplify data of bit lines according to a sensing control signal; a fail detection circuit configured to calculate counting values of fail bits for each temperature based on the data and configured to generate a minimum error code for each temperature by detecting a minimum value for each temperature from the counting values for each temperature, in response to a test mode signal; and a sense amplifying control circuit configured to drive the pull-up voltage line and the pull-down voltage line by generating a pull-up voltage and a pull-down voltage corresponding to current temperature information based on the minimum error code for each temperature and configured to generate the sensing control signal according to the test mode signal.

According to an embodiment of the present disclosure, a memory device includes: a sense amplifying circuit coupled between a pull-up voltage line and a pull-down voltage line and configured to sense and amplify data of bit lines according to a sensing control signal; a fail detection circuit configured to generate a first minimum error code based on counting values of fail bits calculated during a high-temperature test operation and generate a second minimum error code based on counting values of fail bits calculated during a low-temperature test operation; a voltage generation circuit configured to generate a pull-up voltage and a pull-down voltage corresponding to current temperature information in a voltage range defined by the first minimum error code and the second minimum error code; and a sensing control circuit configured to drive the pull-up voltage line and the pull-down voltage line according to the pull-up voltage and the pull-down voltage and configured to generate the sensing control signal.

According to an embodiment of the present disclosure, an operating method of a memory device includes generating a plurality of code combinations by combining a pull-up code and a pull-down code; storing high-temperature counting values by calculating counting values of fail bits based on data read from a plurality of bit lines, during a high-temperature test operation, the high-temperature counting values corresponding to the respective code combinations; storing low-temperature counting values by calculating counting values of fail bits based on the data during a low-temperature test operation, the low-temperature counting values corresponding to the respective code combinations; generating a first minimum error code by comparing the high-temperature counting values with one another, and a second minimum error code by comparing the low-temperature counting values with one another; and sensing and amplifying the data by generating a pull-up voltage and a pull-down voltage corresponding to current temperature information in a voltage range defined by the first minimum error code and the second minimum error code.

The operating method may further comprise applying a test write voltage to the bit lines during the high-temperature test operation or the low-temperature test operation. The operating method may further comprise storing the pull-up code corresponding to a plurality of preliminary pull-up voltages that are set according to a voltage range of the pull-up voltage; and storing the pull-down code corresponding to a plurality of preliminary pull-down voltages that are set according to a voltage range of the pull-down voltage. The generating of the pull-up voltage and the pull-down voltage includes: generating first and second high-temperature reference voltages based on the first minimum error code; generating first and second low-temperature reference voltages based on the second minimum error code; generating a pull-up reference voltage corresponding to the current temperature information based on the first high-temperature reference voltage and the first low-temperature reference voltage; generating the pull-up voltage using the pull-up reference voltage; generating a pull-down reference voltage corresponding to the current temperature information based on the second high-temperature reference voltage and the second low-temperature reference voltage; and generating the pull-down voltage using the pull-down reference voltage.

According to an embodiment of the present disclosure, a memory device includes: a pair of bit lines coupled to respective columns of memory cells; a bit line sense amplifier (BLSA) operable, in an operation mode, according to operational pull-up and pull-down voltages and configured to sense and amplify data of the columns through the pair; and a control circuit configured to: determine the operational pull-up voltage, which corresponds to a current temperature of the memory device, based on a first linear temperature-voltage function determined by predetermined high and low temperatures of the memory device and high-temperature and low-temperature pull-up voltages, and determine the operational pull-down voltage, which corresponds to the current temperature, based on a second linear temperature-voltage function determined by the high and low temperatures and high-temperature and low-temperature pull-down voltage, wherein the high-temperature pull-up and pull-down voltages are predetermined pull-up and pull-down voltages, with which a minimum number of errors are detected from data read from the columns through an operation of the BLSA at the high temperature, and wherein the low-temperature pull-up and pull-down voltages are predetermined pull-up and pull-down voltages, with which a minimum number of errors are detected from data read from the columns through an operation of the BLSA at the low temperature.

According to embodiments of the present disclosure, the memory device may control the sense amplifying circuit by reflecting the actual defect conditions caused by the process skew by calculating the counting values of fail bits through a high-temperature test operation and a low-temperature test operation, respectively. Accordingly, there is an effect of maximizing yield by controlling the sense amplifying circuit according to the sensing characteristics of the memory device.

BRIEF DESCRIPTION OF THE DRAWINGS

FIGS. 6A and 6B are tables for describing a configuration of a voltage code storage circuit of FIG. 5.

FIGS. 7A and 7B are tables for describing a configuration of a per-temperature fail storage circuit of FIG. 5.

FIGS. 9A and 9B are tables for describing an operation of a reference voltage generation circuit of FIG. 2.

DETAILED DESCRIPTION

Figure 1:
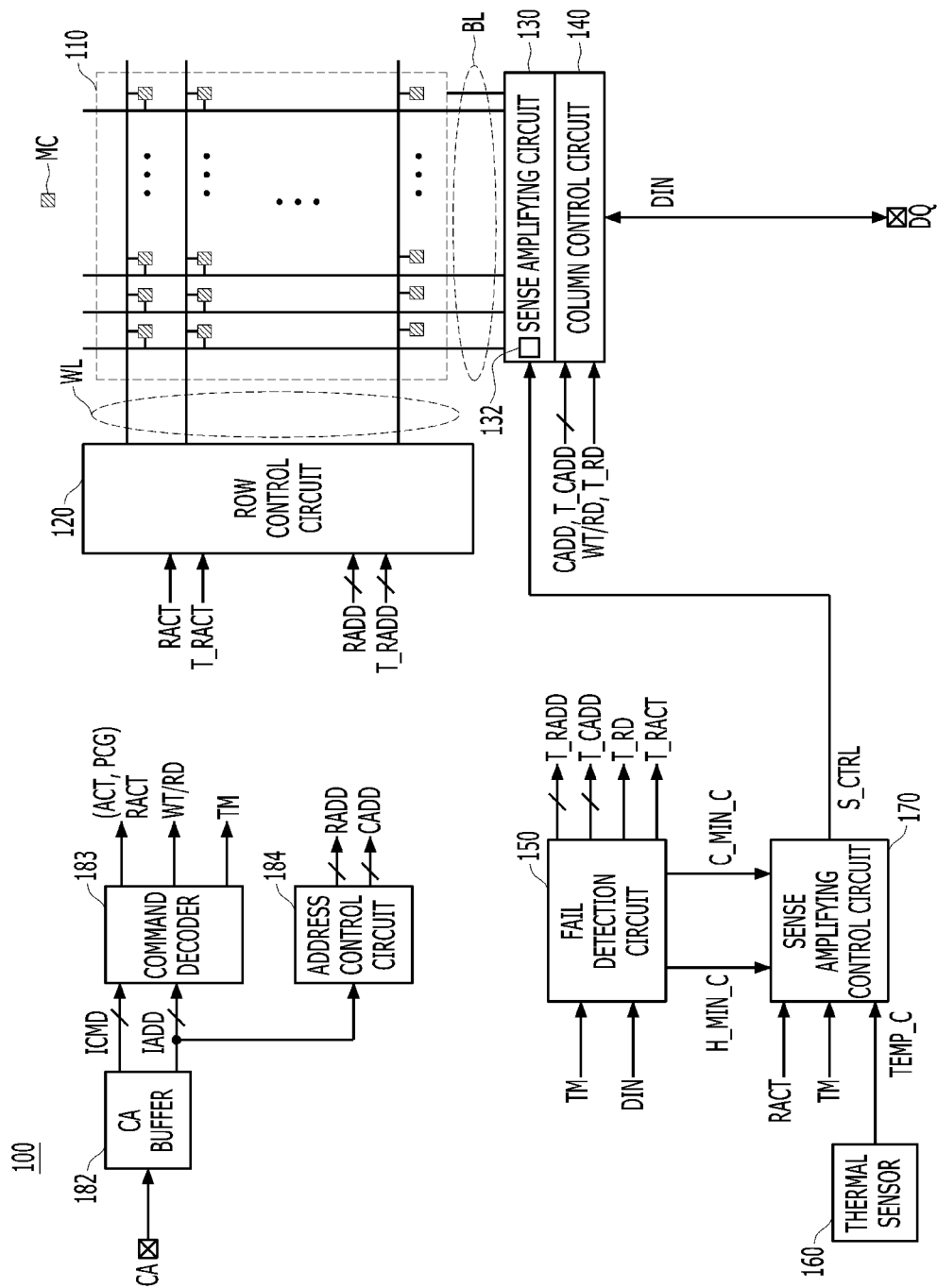
FIG. 1 is a block diagram illustrating a memory device in accordance with an embodiment of the present disclosure.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

To verify variation in an external environment and process with simulation, phased conditions such as 'FF', 'FT', 'FS', 'TF', 'IT', 'TS', 'SF', 'ST', and 'SS' may be used, and there are predetermined skew differences between respective conditions based on 'TT'. Here, 'F' denotes a fast condition, 'T' denotes a typical condition, and 'S' denotes a slow condition. When sense amplifying circuits of chips are controlled unconditionally and equally based on the TT condition despite that one of the chips has a characteristic of FS/SF/FF/SS conditions other than the TT condition, the chip may become defective because the TT condition is unfavorable to the sensing ability of the chip. This situation eventually leads to a decrease in yield.

In accordance with an embodiment of the present disclosure, it is considered that a counting value of fail bits varies in high-temperature and low-temperature condition for each chip. Therefore, the sense amplifying circuit for each chip may be monitored to control a driving voltage of the sense amplifying circuit to an optimal voltage.

FIG. 1 is a block diagram illustrating a memory device 100 in accordance with an embodiment of the present disclosure.

Referring to FIG. 1, the memory device 100 may include a memory cell array 110, a row control circuit 120, a sense amplifying circuit 130, a column control circuit 140, a fail detection circuit 150, a thermal sensor 160, a sense amplifying control circuit 170, a command/address (CA) buffer 182, a command decoder 183, and an address control circuit 184.

The memory cell array 110 may include a plurality of memory cells MC coupled to a plurality of word lines WL and a plurality of bit lines BL may be arranged in the form of an array. The memory cell array 110 may be composed of at least one bank. The number of banks or the number of memory cells MC may be determined depending on the capacity of the memory device 100.

The CA buffer 182 may receive a command/address signal C/A from an external device (e.g., a memory controller or a test device). The CA buffer 182 may sample the command/address signal C/A to output an internal command ICMD and an internal address IADD.

The command decoder 183 may decode the internal command ICMD which is output from the CA buffer 182 to generate an active command ACT, a precharge command PCG, a test mode signal TM, a read command RD, a write command WT, and the like. The test mode signal TM may be a signal activated during a test operation of the memory device 100, and preferably may be activated during a wafer test operation in which the memory device 100 is connected to the test device to perform the test operation. The memory device 100 may generate a row active signal RACT that is activated according to the active command ACT and deactivated according to the precharge command PCG. In FIG. 1, for convenience of description, the command decoder 183 may directly generate the row active signal RACT, but the embodiment is not limited thereto. Although not illustrated, the command decoder 183 may additionally generate a refresh command, a mode register command, and the like by decoding the internal command ICMD.

The address control circuit 184 may classify the internal address IADD received from the CA buffer 182 as a row address RADD and a column address CADD. Depending on an embodiment, the address control circuit 184 may classify some bits of the internal address IADD as the row address RADD and classify the remaining bits as the column address CADD. Alternatively, the address control circuit 184 may classify the internal address IADD as the row address RADD when an active operation is instructed as a result of decoding the command decoder 183, and the internal address IADD as the column address CADD when a read or write operation is instructed as a result of decoding the command decoder 183.

The row control circuit 120 may be coupled to the memory cell array 110 through the word lines WL. The row control circuit 120 may activate a word line corresponding to the row address RADD according to the row active signal RACT. In an embodiment of the present disclosure, the row control circuit 120 may activate the word line corresponding to a test row address T_RADD according to a test active signal T_RACT activated during the test operation.

The sense amplifying circuit 130 may be coupled to the memory cell area 110 through the bit lines BL. The sense amplifying circuit 130 may be coupled between a pull-up voltage line RTO (see FIG. 2) and a pull-down voltage line SB (see FIG. 2) and may sense and amplify data of the bit lines BL according to a sensing control signal S_CTRL. The sense amplifying circuit 130 may include a plurality of bit line sense amplifiers (BLSA) 132 corresponding to the bit lines BL. For example, the bit line sense amplifiers 132 may be connected to a pair of bit lines, respectively, to sense and amplify a voltage difference between the pair of bit lines.

The column control circuit 140 may select some of the bit lines BL according to the column address CADD. The column control circuit 140 may read data from the memory cell array 110 through the selected bit lines BL according to the read command RD, and write data DIN provided externally to the memory cell array 110 through the selected bit lines BL according to the write command WT. The column control circuit 140 may be coupled to a data pad DQ to transmit and receive the data DIN to and from the external device. In an embodiment of the present disclosure, the column control circuit 140 may select a predetermined number of the bit lines BL corresponding to a test column address T_CADD and read data from the memory cell array 110 through the selected bit lines BL, according to a test read signal T_RD activated during the test operation.

The fail detection circuit 150 may generate test control signals T_RACT and T_RD, and test addresses T_RADD and T_CADD, which are required for the test operation, according to the test mode signal TM. The test control signal T_RACT and T_RD may include the test active signal T_RACT and the test read signal T_RD, and the test addresses T_RADD and T_CADD may include the test row address T_RADD and the test column address T_CADD. In response to the test mode signal TM, the fail detection circuit 150 may calculate counting values of fail bits for each of the temperatures based on the data DIN read from the memory cell array 110, and generate minimum error codes H_MIN_C and C_MIN_C for the respective temperatures by detecting a minimum value from the counting values for each of the temperatures.

During the wafer test operation, the fail detection circuit 150 may perform a test operation (hereinafter, referred to as a high-temperature test operation) under a high-temperature condition (e.g., about +95 degrees) provided by the test device, and a test operation (hereinafter, referred to as a low-temperature test operation) under a low-temperature condition (e.g., about −35 degrees) provided by the test device. During the high-temperature test operation, the fail detection circuit 150 may calculate the counting values of the fail bits for a high temperature based on the data DIN, detect the minimum value from the counting values for the high temperature, and generate a first minimum error code H_MIN_C for the high temperature. In addition, during the low-temperature test operation, the fail detection circuit 150 may calculate the counting values of the fail bits for a low temperature based on the data DIN, detect the minimum value from the counting values for the low temperature, and generate a second minimum error code C_MIN_C for the low temperature. Each of the first minimum error code H_MIN_C and the second minimum error code C_MIN_C may be configured as a multi-bit. A detailed configuration and operation of the fail detection circuit 150 will be described with reference to FIGS. 5 to 8.

The thermal sensor 160 may measure an internal temperature of the memory device 100, and store and output current temperature information TEMP_C. The thermal sensor 160 may update the stored current temperature information TEMP_C every predetermined time. According to an embodiment, the thermal sensor 160 may be embedded inside or disposed outside the memory device 100.

The sense amplifying control circuit 170 may generate the sensing control signal S_CTRL according to the row active signal RACT or the test mode signal TM. For example, the sense amplifying control circuit 170 may generate the sensing control signal S_CTRL according to the row active signal RACT during a normal operation, or according to the test mode signal TM during the test operation. The sense amplifying control circuit 170 may drive the pull-up voltage line RTO and the pull-down voltage line SB by generating a pull-up voltage VSAP (see FIG. 2) and a pull-down voltage VSAN (see FIG. 2) corresponding to the current temperature information TEMP_C based on the minimum error codes H_MIN_C and C_MIN_C for respective temperatures, the minimum error codes H_MIN_C and C_MIN_C being provided from the fail detection circuit 150. In particular, the sense amplifying control circuit 170 may generate the pull-up voltage VSAP and the pull-down voltage VSAN corresponding to the current temperature information TEMP_C in a voltage range defined by the first minimum error code H_MIN_C generated by the high-temperature test operation and the second minimum error code C_MIN_C generated by the low-temperature test operation.

Figure 2:
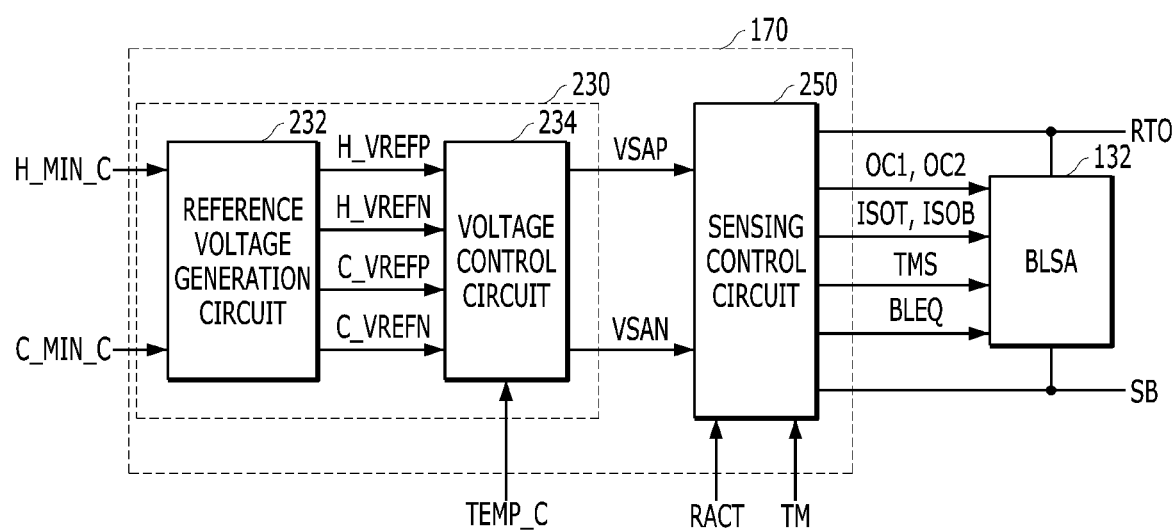
FIG. 2 is a detailed block diagram illustrating a sense amplifying control circuit of FIG. 1 in accordance with an embodiment of the present disclosure.

FIG. 2 is a detailed block diagram illustrating the sense amplifying control circuit 170 of FIG. 1 in accordance with an embodiment of the present disclosure. FIG. 2 shows the sense amplifying control circuit 170 for controlling one bit line sense amplifier 132 for clear illustration.

Referring to FIG. 2, the sense amplifying control circuit 170 may include a voltage generation circuit 230 and a sensing control circuit 250.

The voltage generation circuit 230 may generate the pull-up voltage VSAP and the pull-down voltage VSAN corresponding to the current temperature information TEMP_C based on the minimum error codes H_MIN_C and C_MIN_C for respective temperatures.

More specifically, the voltage generation circuit 230 may include a reference voltage generation circuit 232 and a voltage control circuit 234.

The reference voltage generation circuit 232 may generate a first high-temperature reference voltage H_VREFP and a second high-temperature reference voltage H_VREFN according to the first minimum error code H_MIN_C. The reference voltage generation circuit 232 may generate a first low-temperature reference voltage C_VREFP and a second low-temperature reference voltage C_VREFN. A detailed configuration of the reference voltage generation circuit 232 will be described with reference to FIGS. 9A and 9B.

The voltage control circuit 234 may generate the pull-up voltage VSAP corresponding to the current temperature information TEMP_C based on the first high-temperature reference voltage H_VREFP and the first low-temperature reference voltage C_VREFP. For example, the voltage control circuit 234 may form a graph that linearly increases/decreases based on (X, Y) coordinates of (high-temperature condition (about 95 degrees), H_VREFP) and (low-temperature condition (about −35 degrees), C_VREFP), and may determine the pull-up voltage VSAP as a Y coordinate value corresponding to the current temperature information TEMP_C as a X coordinate value in the graph.

Further, the voltage control circuit 234 may generate the pull-down voltage VSAN corresponding to the current temperature information TEMP_C based on the second high-temperature reference voltage H_VREFN and the second low-temperature reference voltage C_VREFN. For example, the voltage control circuit 234 may form a graph that linearly increases/decreases based on (X, Y) coordinates of (high-temperature condition (about 95 degrees), H_VREFN) and (low-temperature condition (about −35 degrees), C_VREFN), and may determine the pull-down voltage VSAN as a Y coordinate value corresponding to the current temperature information TEMP_C as a X coordinate value in the graph. A detailed configuration and operation of the voltage control circuit 234 will be described with reference to FIG. 10.

The sensing control circuit 250 may drive the pull-up voltage line RTO and the pull-down voltage line SB according to the pull-up voltage VSAP and the pull-down voltage VSAN, and generate the sensing control signal S_CTRL according to the row active signal RACT or the test mode signal TM. The sensing control signal S_CTRL may include a first offset cancellation signal OC1, a second offset cancellation signal OC2, a first isolation signal ISOT, a second isolation signal ISOB, a test pulse TMS, and a bit line precharge signal BLEQ (see FIGS. 3, 11 and 13). A detailed configuration of the sensing control circuit 250 will be described with reference to FIGS. 11 to 13.

The bit line sense amplifier 132 may amplify a voltage difference of a pair of bit lines by receiving a power supply voltage between the pull-up voltage line RTO and the pull-down voltage line SB, and performing an offset cancellation operation according to the first offset cancellation signal OC1, the second offset cancellation signal OC2, the first isolation signal ISOT, and the second isolation signal ISOB. In particular, in an embodiment of the present disclosure, the bit line sense amplifier 132 may output data of a logic high level regardless of data stored in a memory cell, by applying a test write voltage VWT to one of the pair of bit lines according to the test pulse TMS. The test write voltage VWT may have a level of a core voltage VCORE.

Figure 3:
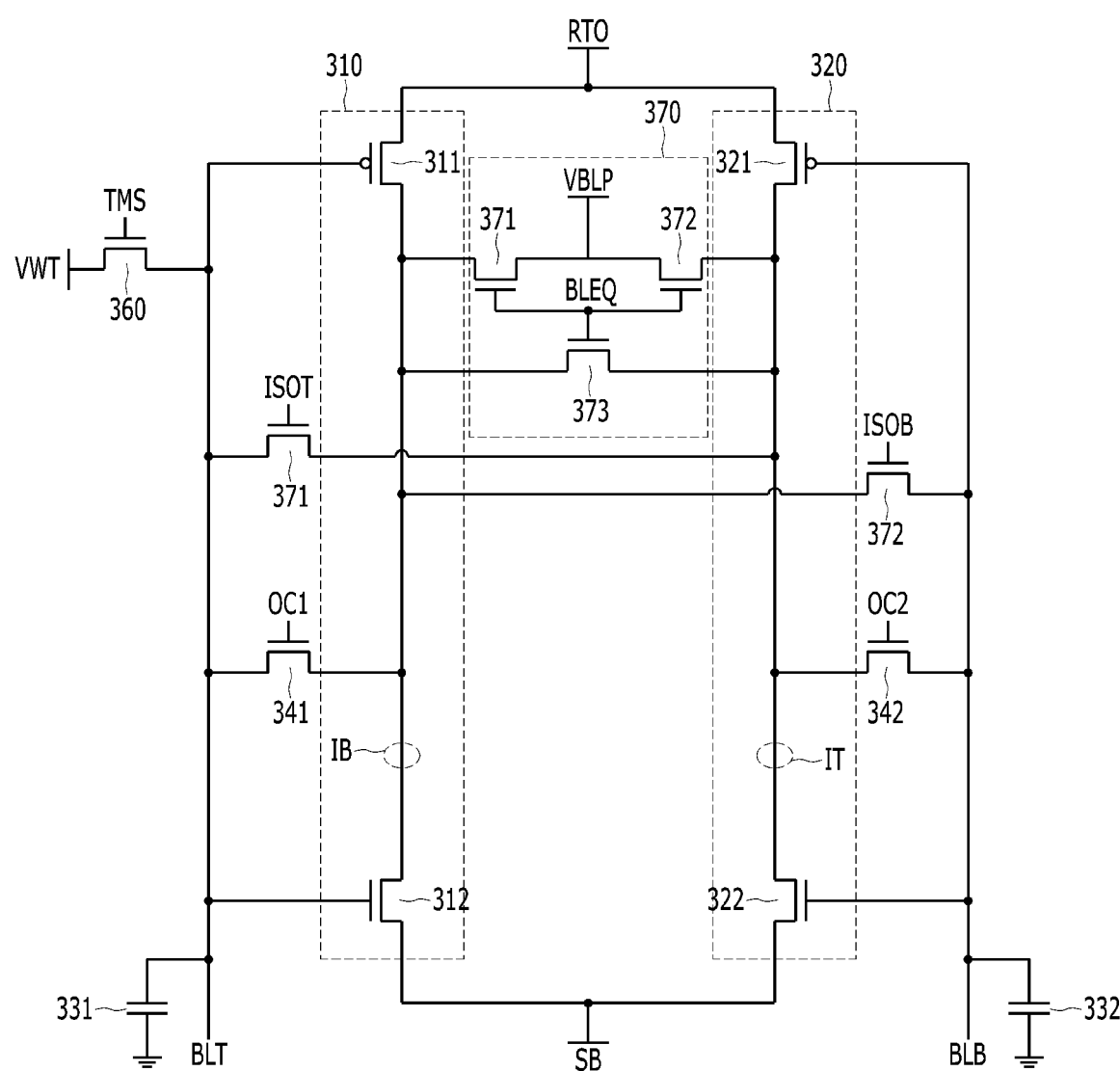
FIG. 3 is a circuit diagram illustrating a bit line sense amplifier of FIG. 2.

FIG. 3 is a circuit diagram illustrating the bit line sense amplifier 132 of FIG. 2.

Referring to FIG. 3, the bit line sense amplifier 132 may include a first inverter 310, a second inverter 320, a first offset cancellation switch 341, a second offset cancellation switch 342, a first isolation switch 351, a second isolation switch 352, a test switch 360, and a precharge circuit 370.

The first inverter 310 may have an input terminal coupled to a first bit line BLT and an output terminal coupled to a second inner bit line IB. The second inverter 320 may have an input terminal coupled to a second bit line BLB and an output terminal coupled to a first inner bit line IT. Each of the first inverter 310 and the second inverter 320 may include a PMOS transistor 311 or 321 and an NMOS transistor 312 or 322 coupled in series between the pull-up voltage line RTO and the pull-down voltage line SB, respectively.

The first offset cancellation switch 341 may electrically couple the first bit line BLT to the second inner bit line IB in response to the first offset cancellation signal OC1. The second offset cancellation switch 342 may electrically couple the second bit line BLB to the first inner bit line IT in response to the second offset cancellation signal OC2. Each of the first offset cancellation switch 341 and the second offset cancellation switch 342 may be implemented with an NMOS transistor.

The first isolation switch 351 may electrically couple the first bit line BLT to the first inner bit line IT in response to the first isolation signal ISOT. The second isolation switch 352 may electrically couple the second bit line BLB to the second inner bit line IB in response to the second isolation signal ISOB. Each of the first isolation switch 351 and the second isolation switch 352 may be implemented with an NMOS transistor.

The test switch 360 may apply the test write voltage VWT to one of the first bit line BLT and the second bit line BLB (e.g., the first bit line BLT) according to the test pulse TMS.

In response to the bit line precharge signal BLEQ, the precharge circuit 370 may apply a precharge voltage VBLP to the first bit line BLT and the second bit line BLB. The precharge circuit 370 may include first to third NMOS transistors 371 to 373 coupled between the first bit line BLT and the second bit line BLB. The level of the precharge voltage VBLP may be an intermediate level between a ground voltage VSS and the core voltage VCORE.

A first capacitor 331 may be coupled to the first bit line BLT, and a second capacitor 332 may be coupled to the second bit line BLB. The first capacitor 331 and the second capacitor 332 are parasitic capacitors, and may be configured to store offsets of the first inverter 310 and the second inverter 320 during the offset cancellation operation. Since the offsets of the first inverter 310 and the second inverter 320 are stored in the first capacitor 331 and the second capacitor 332, the offsets of the first inverter 310 and the second inverter 320 may be accurately stored even if the lengths of the first bit line BLT and the second bit line BLB are different or loading are different.

Hereinafter, a sensing operation of the bit line sense amplifier 132 will be described with reference to FIGS. 4A to 4B.

Figure 4A:
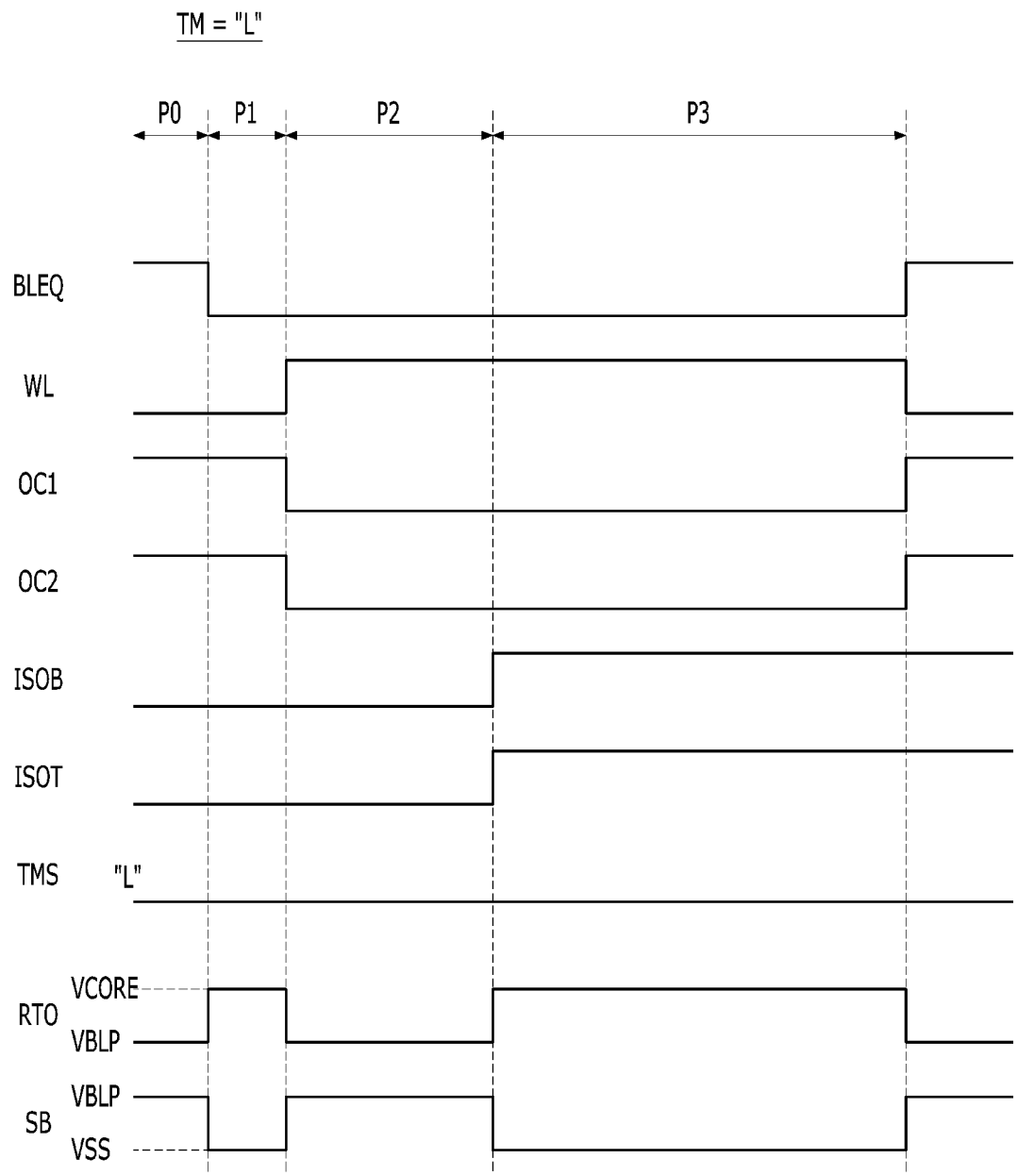
FIGS. 4A and 4B are timing diagrams for describing an operation of the bit line sense amplifier of FIG. 3.

FIG. 4A is a timing diagram for describing a normal operation of the bit line sense amplifier 132 of FIG. 3.

Referring to FIG. 4A, the normal operation of the bit line sense amplifier 132 may be performed in the order of a precharge operation P0, an offset cancellation operation P1, a charge sharing operation P2, and an amplification operation P3. In the normal operation, the test pulse TMS may maintain an inactive state at a logic low level.

During the precharge operation P0, the bit line precharge signal BLEQ, first offset cancellation signal OC1, and the second offset cancellation signal OC2 are activated at a logic high level, and the first isolation signal ISOT and the second isolation signal ISOB are deactivated at a logic low level. In response to the bit line precharge signal BLEQ, the precharge circuit 370 may apply the precharge voltage VBLP to the first bit line BLT and the second bit line BLB. In response to the first offset cancellation signal OC1 and the second offset cancellation signal OC2, the first offset cancellation switch 341 and the second offset cancellation switch may be turned on. As a result, during the precharge operation P0, the first inner bit line IT, the second inner bit line IB, the first bit line BLT, and the second bit line BLB are precharged with the precharge voltage VBLP, so that the first inverter 310 and the second inverter 320 may be deactivated.

During the offset cancellation operation P1, the first offset cancellation signal OC1 and the second offset cancellation signal OC2 are activated, and the bit line precharge signal BLEQ, the first isolation signal ISOT, and the second isolation signal ISOB are deactivated. At this time, the first inverter 310 and the second inverter 320 may be activated by supplying the pull-up voltage of a core voltage (VCORE) level to the pull-up voltage line RTO and a pull-down voltage of a ground voltage (VSS) level to the pull-down voltage line SB. The first offset cancellation switch 341 and the second offset cancellation switch 342 may be turned on, so that the input and output terminals of the first inverter 310 may be coupled to each other, and the input and output terminals of the second inverter 320 may be coupled to each other. As a result, since both the input and output terminals of the first inverter 310 are coupled to the first capacitor 331, both the PMOS transistor 311 and the NMOS transistor 312 in the first inverter 310 are diode-connected. Therefore, a type of equilibrium state reflecting the offset of the PMOS transistor 311 and the NMOS transistor 312 may be stored in the first capacitor 331. In addition, since both the input and output terminals of the second inverter 320 are coupled to the second capacitor 332, both the PMOS transistor 321 and the NMOS transistor 322 in the second inverter 320 are diode-connected. Therefore, a type of equilibrium state reflecting the offset of the PMOS transistor 321 and the NMOS transistor 322 in the second inverter 320 may be stored in the second capacitor 332.

During the charge sharing operation P2, the bit line precharge signal BLEQ, the first isolation signal ISOT, the second isolation signal ISOB, the first offset cancellation signal OC1 and the second offset cancellation OC2 are disabled at a logic low level, and a selected word line WL is activated. In this case, the precharge voltage VBLP may be applied to the pull-up voltage line RTO and the pull-down voltage line SB. While the first bit line BLT and the second bit line BLB are separated from each other, a cell transistor of the memory cell MC coupled to the selected word line WL may be turned on to perform a charge sharing operation in which the charge stored in the cell capacitor flows into the first bit line BLT. The voltage level (VBLP+ΔV) of the first bit line BLT may be slightly higher or lower than the voltage level of the second bit line BLB by the charge sharing operation.

During the amplification operation P3, the first isolation signal ISOT and the second isolation signal ISOB are activated, and the pull-up voltage line RTO and the pull-down voltage line SB are supplied with the core voltage (VCORE) level and the ground voltage (VSS) level. The first isolation switch 351 and the second isolation switch 352 may be turned on, so that the first bit line BLT is coupled to the first inner bit line IT, and the second bit line BLB is coupled to the second inner bit line IB. Accordingly, a voltage difference between the first bit line BLT and the second bit line BLB may be amplified. Since the amplification operation is performed in a state that the voltages reflecting the offsets of the first inverter 310 and the second inverter 320 which are stored in the first capacitor 331 and the second capacitor 332, the bit line sense amplifier 132 may perform the amplification operation very accurately. That is, an offset voltage for ensuring an accurate operation of the bit line sense amplifier 132 may be reduced.

Figure 4B:
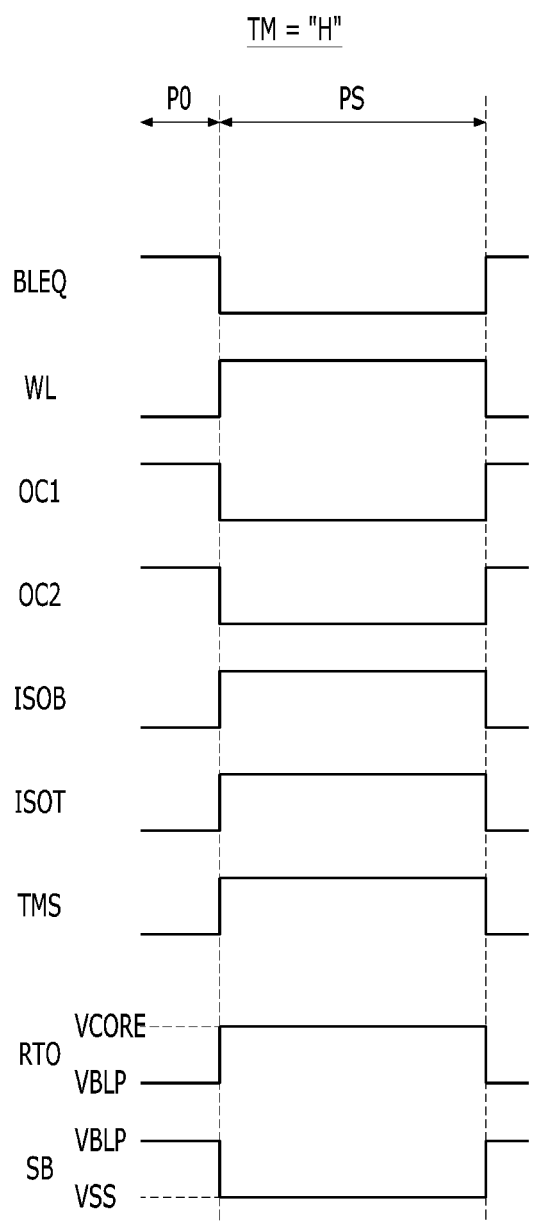

FIG. 4B is a timing diagram for describing a test operation of the bit line sense amplifier 132 of FIG. 3.

Referring to FIG. 4B, the test operation of the bit line sense amplifier 132 may be performed in the order of a precharge operation P0 and a test pulse application operation PS.

The precharge operation P0 of FIG. 4B is substantially the same as the precharge operation P0 of FIG. 4A, and thus a detailed description thereof will be omitted.

During the test pulse application operation PS, the first offset cancellation signal OC1 and the second offset cancellation signal OC2 are deactivated at a logic low level, the first isolation signal ISOT and the second isolation signal ISOB logic are activated at a logic high level, and the selected word WL is activated. At this time, the test pulse TMS is also activated at a logic high level, and the test switch 360 may apply the test write voltage VWT to the first bit line BLT. Accordingly, the bit line sense amplifier 132 may output data of a logic high level regardless of the data stored in the memory cell.

As described above, in an embodiment of the present disclosure, the test operation may be performed through a pseudo-write operation that directly applies a specific voltage to the bit line without performing a write operation to write a preset test pattern to the memory cells. Thus, the test operation may be performed regardless of a defect of the memory cell.

Figure 5:
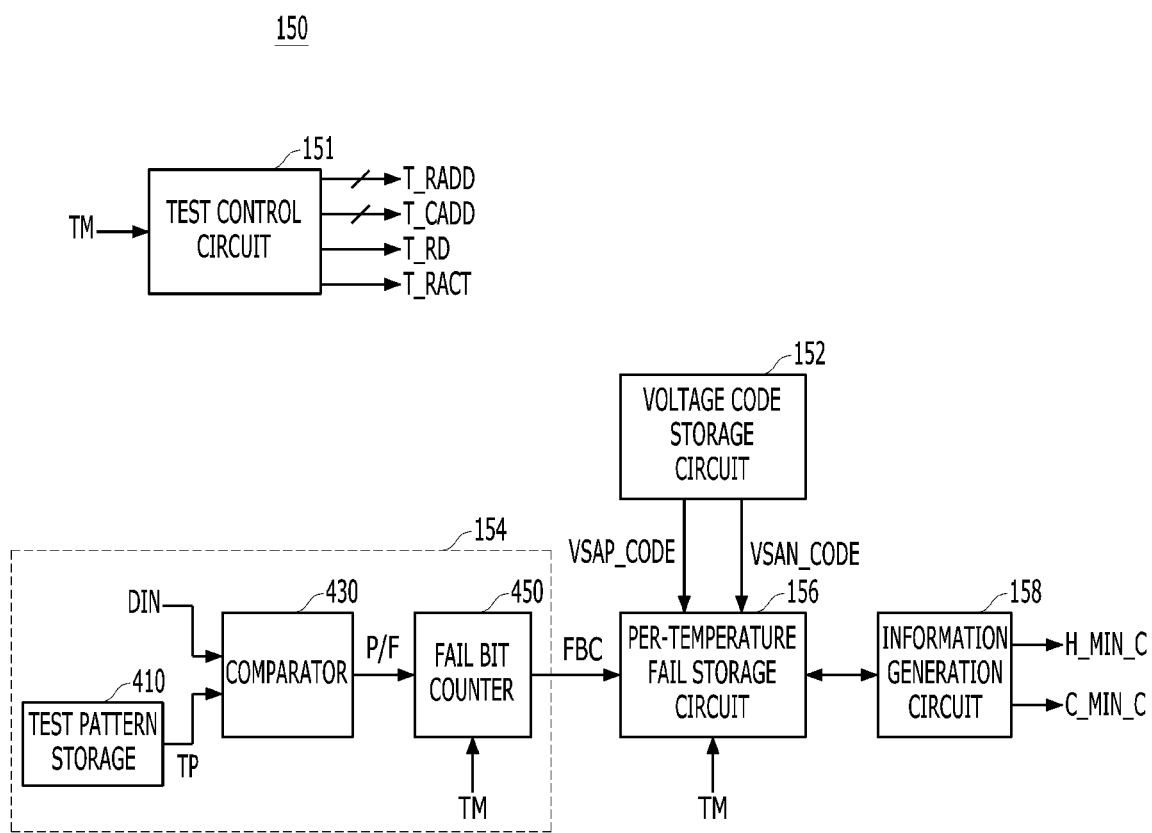
FIG. 5 is a detailed block diagram illustrating a fail detection circuit of FIG. 1 in accordance with an embodiment of the present disclosure.

FIG. 5 is a detailed block diagram illustrating the fail detection circuit 150 of FIG. 1 in accordance with an embodiment of the present disclosure. FIGS. 6A and 6B are tables for describing a configuration of a voltage code storage circuit 152 of FIG. 5. FIGS. 7A and 7B are tables for describing a configuration of a per-temperature fail storage circuit 156 of FIG. 5.

Referring to FIG. 5, the fail detection circuit 150 may include a test control circuit 151, a voltage code storage circuit 152, a fail counting circuit 154, a per-temperature fail storage circuit 156, and an information generation circuit 158.

The test control circuit 151 may generate the test active signal T_RACT, the test read signal T_RD, the test row address T_RADD, and the test column address T_CADD, which are required for the test operation, according to the test mode signal TM. For example, the test control circuit 151 may activate the test active signal T_RACT according to the test mode signal TM. The test control circuit 151 may increase a value of the test row address T_RADD as the test active signal T_RACT is activated to control the plurality of word lines to be sequentially selected during the test operation. The test control circuit 151 may generate the test read signal T_RD a predetermined number of times while activating the test active signal T_RACT. The test control circuit 151 may control a predetermined number of bit lines to be sequentially selected during the test operation by increasing a value of the test column address T_CADD as the test read signal T_RD is generated. Accordingly, the data DIN may be sequentially output from the memory cell array 110 during the test operation according to the test mode signal TM.

The voltage code storage circuit 152 may store a pull-up code VSAP_CODE corresponding to a plurality of preliminary pull-up voltages and a pull-down code VSAN_CODE corresponding to a plurality of preliminary pull-down voltages. Each of the pull-up code VSAP_CODE and the pull-down code VSAN_CODE may be configured as a multi-bit. The plurality of preliminary pull-up voltages may be set according to a voltage range of the pull-up voltage VSAP, and the plurality of preliminary pull-down voltages may be set according to a voltage range of the pull-down voltage VSAN.

For example, referring to FIG. 6A, when the voltage range of the pull-up voltage VSAP is set from 1.9V to 2.2V, the plurality of preliminary pull-up voltages may have levels of 1.9V, 2.0V, 2.1V, and 2.2V in 0.1V units, and the pull-up code VSAP_CODE may be configured by 2 bits (i.e., VSAP_CODE<1:0>) of 00, 01, 10, and 11 to define the plurality of preliminary pull-up voltages, respectively. Referring to FIG. 6B, when the voltage range of the pull-down voltage VSAN is set from 1.0V to 1.3V, the plurality of preliminary pull-down voltages may have levels of 1.0V, 1.1V, 1.2V, and 1.3V in 0.1V units, the plurality of preliminary pull-down code VSAN_CODE may be configured by 2 bits (i.e., VSAN_CODE<1:0>) of 00, 01, 10, and 11 to define the plurality of preliminary pull-down voltages, respectively.

The fail counting circuit 154 may calculate a counting value FBC for each temperature by comparing the data DIN read from the memory cell array 110 with a preset test pattern TP, and counting the number of fail bits for each temperature, in response to the test mode signal TM.

More specifically, the fail counting circuit 154 may include a test pattern storage 410, a comparator 430, and a fail bit counter 450. The test pattern storage 410 may store the preset test pattern TP on a bit-by-bit basis. The test pattern TP may be set as an expected value of the data DIN expected when fails do not occur. The comparator 430 may output a pass/fail signal P/F by comparing the data DIN read from the memory cell array 110 with the test pattern TP on a bit-by-bit basis. The comparator 430 may output the pass signal P when the comparison result matches, and may output the fail signal F when the comparison result does not match. When the test mode signal TM is activated, the fail bit counter 450 may count the pass/fail signal P/F to generate the counting value FBC. For example, the fail bit counter 450 may maintain the counting value FBC when the pass signal P is input, and increase the counting value FBC by "+1" when the fail signal F is input.

The per-temperature fail storage circuit 156 may generate and store a plurality of code combinations by combining the pull-up code VSAP_CODE and the pull-down code VSAN_CODE according to the test mode signal TM. The per-temperature fail storage circuit 156 may sequentially store the counting value FBC provided from the fail bit counter 450 during the test operation according to each code combination. In particular, the per-temperature fail storage circuit 156 may manage the counting values per temperature by sequentially storing the counting value FBC corresponding to each code combination as high-temperature counting values H_FBC during the high-temperature test operation, and by sequentially storing the counting value FBC corresponding to each code combination as low-temperature counting values C_FBC during the low-temperature test operation.

The information generation circuit 158 may output the code combinations stored in the per-temperature fail storage circuit 156 as the minimum error codes H_MIN_C and C_MIN_C for respective temperatures during the test operation according to the test mode signal TM. After the test operation is completed, the information generation circuit 158 may detect a minimum value from the counting values for the code combinations for each of the temperatures, to output and store code combinations corresponding to the minimum values as the minimum error codes H_MIN_C and C_MIN_C for the respective temperatures. In detail, the information generation circuit 158 may sequentially output the first minimum error code H_MIN_C corresponding to the code combinations during the high-temperature test operation, and, after the high-temperature test operation is completed, compare the high-temperature counting values H_FBC with one another to output and store a code combination corresponding to a minimum value as the first minimum error code H_MIN_C for the high temperature. The information generation circuit 158 may sequentially output the second minimum error code C_MIN_C corresponding to the code combinations during the low-temperature test operation, and, after the low-temperature test operation is completed, compare the low-temperature counting values C_FBC with one another to output and store a code combination corresponding to a minimum as the second minimum error code C_MIN_C for the low temperature.

For example, referring to FIG. 7A, during the high-temperature test operation, the per-temperature fail storage circuit 156 may generate the code combinations "Combined CODE" from 0000 to 1111 by combining the pull-up code VSAP_CODE and the pull-down code VSAN_CODE. The information generation circuit 158 may sequentially output the code combinations "Combined CODE" from 0000 to 1111 as the first minimum error code H_MIN_C. Accordingly, the high-temperature test operation may be performed. The per-temperature fail storage circuit 156 may store the counting values provided from the fail bit counter 450 as the high-temperature counting values H_FBC during the high-temperature test operation according to each code combination. For example, after the test operation is performed based on the pull-up voltage VSAP of 1.9V and the pull-down voltage VSAN of 1.0V generated according to the first minimum error code H_MIN_C of 0000, the per-temperature fail storage circuit 156 may store the counting value of 100 provided from the fail bit counter 450 as the high-temperature counting value H_FBC. In this way, after the test operation is performed based on the pull-up voltage VSAP of 2.2V and the pull-down voltage VSAN of 1.3V generated according to the first minimum error code H_MIN_C of 1111, the per-temperature fail storage circuit 156 may store the count value of 50000 provided from the fail bit counter 450 as the high-temperature counting value H_FBC. After the high-temperature test operation is completed, the information generation circuit 158 may compare the stored high-temperature counting values H_FBC with one another to detect 100 as a minimum value, and output the code combination of 0000 corresponding to the minimum value, as the first minimum error code H_MIN_C.

Referring to FIG. 7B, during the low-temperature test operation, the per-temperature fail storage circuit 156 may generate the code combinations "Combined CODE" from 0000 to 1111 by combining the pull-up code VSAP_CODE and the pull-down code VSAN_CODE. The information generation circuit 158 may sequentially output the code combinations "Combined CODE" from 0000 to 1111 as the second minimum error code C_MIN_C. Accordingly, the low-temperature test operation may be performed. The per-temperature fail storage circuit 156 may store the counting values provided from the fail bit counter 450 as the low-temperature counting values C_FBC during the low-temperature test operation according to each code combination. After the low-temperature test operation is completed, the information generation circuit 158 may compare the stored low-temperature counting values C_FBC with one another to detect 30 as a minimum value, and output the code combination of 1011 corresponding to the minimum value, as the second minimum error code C_MIN_C.

Hereinafter, as shown in FIGS. 7A and 7B, a case where each of the first minimum error code H_MIN_C and the second minimum error code C_MIN_C is composed of 4-bits, that is, VSAN_CODE<1>, VSAN_CODE<0>, VSAP_CODE<1>, VSAP_CODE<0> in the order of most significant bit (MSB), will be described as an example.

Referring to FIGS. 1 to 8, it will be described that the minimum error codes H_MIN_C and C_MIN_C for respective temperatures according to the test operation are generated.

Figure 8:
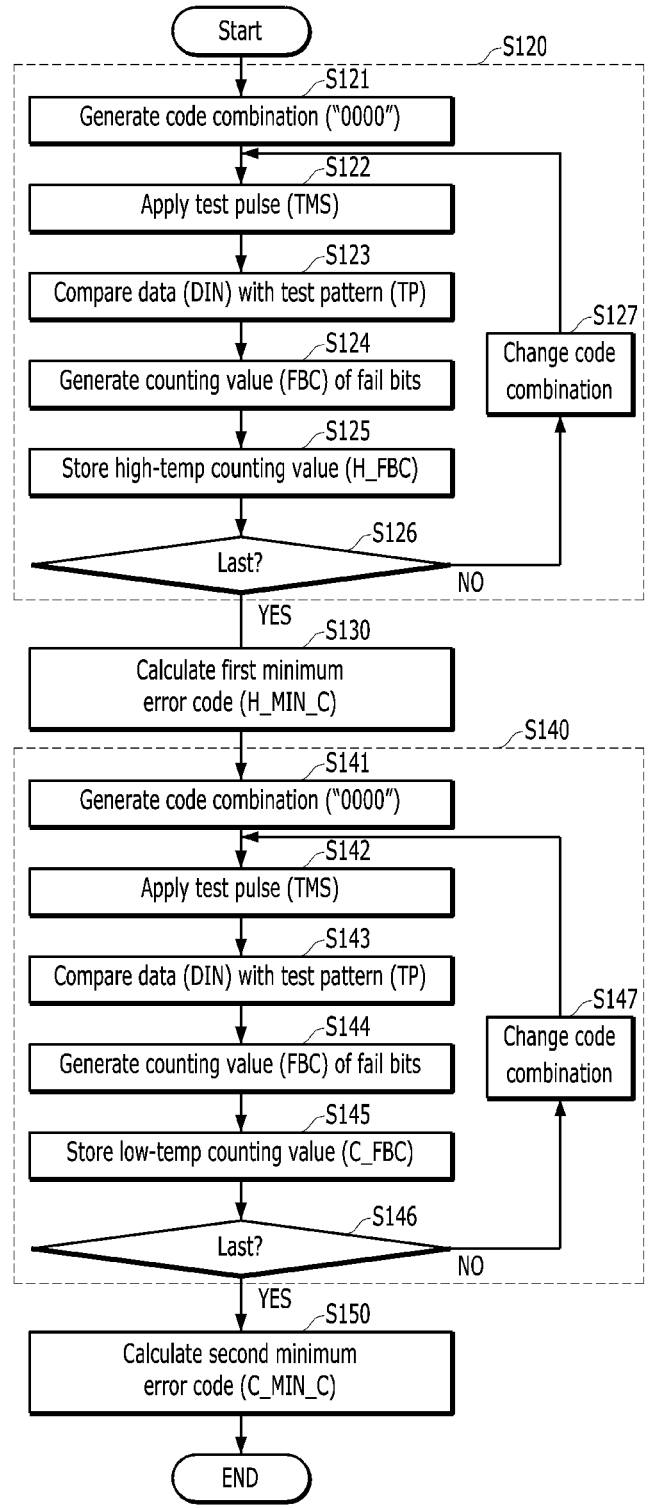
FIG. 8 is a flow chart for describing an operation of a fail detection circuit in accordance with an embodiment of the present disclosure.

FIG. 8 is a flow chart for describing an operation of the fail detection circuit 150 in accordance with an embodiment of the present invention.

Referring to FIG. 8, as the test mode signal TM is activated during a wafer test operation, a high-temperature test operation (at S120) under a high-temperature condition (e.g., about +95 degrees) provided by a test device, or a low-temperature test operation (at S140) under a low-temperature condition (e.g., about −35 degrees) provided by the test device, may be performed. In the following embodiment, an example in which the high-temperature test operation of S120 is first performed will be described.

During the high-temperature test operation of S120, the per-temperature fail storage circuit 156 may generate and store the code combinations of the pull-up code VSAP_CODE and the pull-down code VSAN_CODE (at S121). First, the per-temperature fail storage circuit 156 may output the first minimum error code H_MIN_C for a code combination of 0000. In the high-temperature test operation, the second minimum error code C_MIN_C may be fixed to a specific code (for example, 0000).

The voltage generation circuit 230 may generate the pull-up voltage VSAP and the pull-down voltage VSAN corresponding to the current temperature information TEMP_C based on the first minimum error code H_MIN_C and the second minimum error code C_MIN_C. As described in FIG. 4B, the sensing control circuit 250 may drive the pull-up voltage line RTO and the pull-down voltage line SB according to the pull-up voltage VSAP and the pull-down voltage VSAN, and may provide the test pulse TMS and the test write voltage VWT to the bit line sense amplifier 132. The bit line sense amplifier 132 may receive a power supply voltage between the pull-up voltage line RTO and the pull-down voltage line SB, and output the data DIN, regardless of the data stored in the memory cell, by applying the test write voltage VWT to the first bit line BLT according to the test pulse TMS (at S122).

The fail counting circuit 154 may calculate the count value FBC of the fail bits for the high temperature (at S124) by comparing the data DIN with the preset test pattern TP on a bit-by-bit basis (at S123). As described in FIG. 7A, the per-temperature fail storage circuit 156 may store the counting value of 100 provided from the fail bit counter 450 as the high-temperature counting value H_FBC (at S125).

Thereafter, the code combination is increased and changed to 0001 (at S127), and the above operations of S121 to S125 may be repeated before the code combination reaches the last value of 1111 ("NO" in S126). Accordingly, as described in FIG. 7A, the per-temperature fail storage circuit 156 may store the high-temperature counting values H_FBC for each code combination.

Then, when the code combination reaches the last value of 1111 ("YES" in S126), and the high-temperature test operation of S120 ends, the per-temperature failure storage circuit 156 may detect 100 as the minimum value of the high-temperature counting values H_FBC, and store and output the code combination of 0000 as the first minimum error code H_MIN_C (at S130).

The low-temperature test operation of S140 may be performed substantially similar to the high-temperature test operation of S120. The per-temperature fail storage circuit 156 may generate and store the code combinations of the pull-up code VSAP_CODE and the pull-down code VSAN_CODE (at S141). The per-temperature fail storage circuit 156 may output the second minimum error code C_MIN_C for a code combination of 0000. In the low-temperature test operation, the first minimum error code C_MIN_C may be fixed to a specific code (for example, 0000).

The voltage generation circuit 230 may generate the pull-up voltage VSAP and the pull-down voltage VSAN corresponding to the current temperature information TEMP_C based on the first minimum error code H_MIN_C and the second minimum error code C_MIN_C. As described in FIG. 4B, the bit line sense amplifier 132 may receive a power supply voltage between the pull-up voltage line RTO and the pull-down voltage line SB, and output the data DIN, regardless of the data stored in the memory cell, by applying the test write voltage VWT to the first bit line BLT according to the test pulse TMS (at S142).

The fail counting circuit 154 may calculate the count value FBC of the fail bits for the low temperature (at S144) by comparing the data DIN with the preset test pattern TP on a bit-by-bit basis (at S143). As described in FIG. 7B, the per-temperature fail storage circuit 156 may store the counting value of 80 provided from the fail bit counter 450 as the low-temperature counting value C_FBC (at S145).

Thereafter, the code combination is increased and changed to 0001 (at S147), and the above operations of S141 to S145 may be repeated before the code combination reaches the last value of 1111 ("NO" in S146). Accordingly, as described in FIG. 7B, the per-temperature fail storage circuit 156 may store the low-temperature counting values C_FBC for each code combination.

Then, when the code combination reaches the last value of 1111 ("YES" in S146), and the low-temperature test operation of S140 ends, the per-temperature failure storage circuit 156 may detect 30 as the minimum value of the low-temperature counting values C_FBC, and store and output the code combination of 1011 as the second minimum error code C_MIN_C (at S150).

After the test mode ends, during the normal operation, the sense amplifying control circuit 170 may generate the pull-up voltage VSAP and the pull-down voltage VSAN corresponding to the current temperature information TEMP_C in a voltage range defined by the first minimum error code H_MIN_C and the second minimum error code C_MIN_C. The sense amplifying circuit 130 may sense and amplify data of the bit lines BL.

FIGS. 9A and 9B are tables for describing an operation of the reference voltage generation circuit 232 of FIG. 2.

Referring to FIG. 9A, the reference voltage generation circuit 232 may generate the first high-temperature reference voltage H_VREFP according to LSB 2-bit (i.e., VSAP_CODE<1> and VSAP_CODE<0>) in the first minimum error code H_MIN_C, and may generate the first low-temperature reference voltage C_VREFP according to LSB 2-bit (i.e., VSAP_CODE<1> and VSAP_CODE<0>) in the second minimum error code C_MIN_C. For example, the reference voltage generation circuit 232 may generate the first high-temperature reference voltage H_VREFP of 0.8V according to 00 from the first minimum error code H_MIN_C of 0000, and the first low-temperature reference voltage C_VREFP of 1.2V according to 11 from the second minimum error code C_MIN_C of 1011.

Referring to FIG. 9B, the reference voltage generation circuit 232 may generate the second high-temperature reference voltage H_VREFN according to MSB 2-bit (i.e., VSAN_CODE<1> and VSAN_CODE<0>) in the first minimum error code H_MIN_C, and may generate the second low-temperature reference voltage C_VREFN according to MSB 2-bit (i.e., VSAN_CODE<1> and VSAN_CODE<0>) in the second minimum error code C_MIN_C. For example, the reference voltage generation circuit 232 may generate the second high-temperature reference voltage H_VREFN of 0.4V according to 00 from the first minimum error code H_MIN_C of 0000, and the second low-temperature reference voltage C_VREFP of 0.8V according to 10 from the second minimum error code C_MIN_C of 1011.

Figure 10:
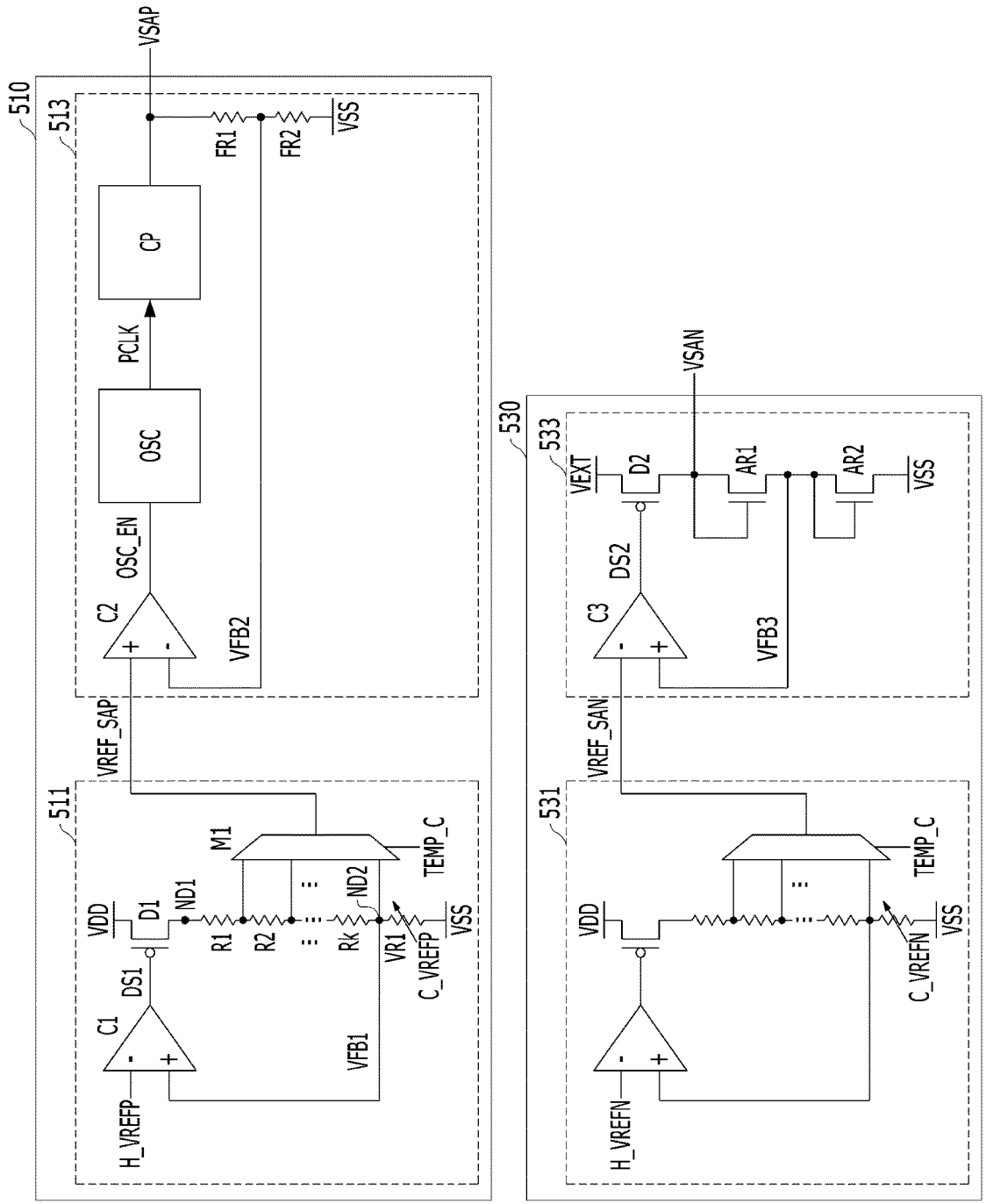
FIG. 10 is a circuit diagram illustrating a voltage control circuit of FIG. 2.

FIG. 10 is a circuit diagram illustrating the voltage control circuit 234 of FIG. 2.

Referring to FIG. 10, the voltage control circuit 234 may include a pull-up voltage control circuit 510 and a pull-down voltage control circuit 530. The pull-up voltage control circuit 510 may generate the pull-up voltage VSAP corresponding to the current temperature information TEMP_C based on the first high-temperature reference voltage H_VREFP and the first low-temperature reference voltage C_VREFP. The pull-down voltage control circuit 530 may generate the pull-down voltage VSAN corresponding to the current temperature information TEMP_C based on the second high-temperature reference voltage H_VREFN and the second low-temperature reference voltage C_VREFN.

The pull-up voltage control circuit 510 may include a first reference voltage regulator 511 and a first voltage generator 513.

The first reference voltage regulator 511 may generate a pull-up reference voltage VREF_SAP corresponding to the current temperature information TEMP_C based on the first high-temperature reference voltage H_VREFP and the first low-temperature reference voltage C_VREFP. The first reference voltage regulator 511 may include a plurality of resistors R1 to Rk coupled in series between the first high-temperature reference voltage H_VREFP and the first low-temperature reference voltage C_VREFP, and may select one of the plurality of resistors R1 to Rk according to the current temperature information TEMP_C to output the pull-up reference voltage VREF_SAP.

For example, the first reference voltage regulator 511 may include a first comparator C1, a first driver D1, the plurality of resistors R1 to Rk, a variable resistor VR1, and a selector M1. The first comparator C1 may receive the first high-temperature reference voltage H_VREFP at a negative (−) input terminal, a first feedback voltage VFB1 at a positive (+) input terminal, and compare them to output a first driving control signal DS1. When the first feedback voltage VFB1 is lower than the first high-temperature reference voltage H_VREFP, the first comparator C1 may generate the first driving control signal DS1 that transitions to a logic low level. The first driver D1 may drive a first node ND1 with a source voltage VDD according to the first driving control signal DS1. The first driver D1 may be implemented with a PMOS transistor that receives the first driving control signal DS1 as a gate. A resistance value of the variable resistor VR1 may vary according to the first low-temperature reference voltage C_VREFP. A voltage level of a second node ND2 may be determined according to the resistance value of the variable resistor VR1. The plurality of resistors R1 to Rk may be coupled in series between the first node ND1 and the second node ND2. The first feedback voltage VFB1 may be output from the second node ND2. The selector M1 may be coupled to common nodes of the resistors R1 to Rk, and select one of the common nodes according to the current temperature information TEMP_C to output the pull-up reference voltage VREF_SAP from the selected node.

With the above configuration, the first reference voltage regulator 511 may determine voltages of the resistors R1 to Rk between the first high-temperature reference voltage H_VREFP and the first low-temperature reference voltage C_VREFP, and output a voltage selected according to the current temperature information TEMP_C as the pull-up reference voltage VREF_SAP.

The first voltage generator 513 may generate the pull-up voltage VSAP based on the pull-up reference voltage VREF_SAP. The first voltage generator 513 may be implemented with a boost voltage generator using a charge pump.

For example, the first voltage generator 513 may include a second comparator C2, an oscillator OSC, a pump CP, and first and second feedback resistors FR1 and FR2. The second comparator C2 may receive the pull-up reference voltage VREF_SAP at a positive (+) input terminal, a second feedback voltage VFB2 at a negative (−) input terminal, and compare them to output an oscillation control signal OSC_EN. When the second feedback voltage VFB2 is lower than the pull-up reference voltage VREF_SAP, the second comparator C2 may generate the oscillation control signal OSC_EN that transitions to a logic high level. The oscillator OSC may be activated according to the oscillation control signal OSC_EN to generate a pumping control signal PCLK. The pumping control signal PCLK may include differential clock signals having inverted phases. The pump CP may pump the source voltage VDD according to the pumping control signal PCLK to generate the pull-up voltage VSAP at a pull-up voltage (VSAP) terminal. The first and second feedback resistors FR1 and FR2 may be coupled in series between the pull-up voltage (VSAP) terminal and the ground voltage (VSS) terminal, and the second feedback voltage VFB2 may be output from a common node of the first and second feedback resistors FR1 and FR2.

With the above configuration, the first voltage generator 513 may generate the pull-up voltage VSAP by performing a pumping operation according to the pull-up reference voltage VREF_SAP.

The pull-down voltage control circuit 530 may include a second reference voltage regulator 531 and a second voltage generator 533.

The second reference voltage regulator 531 may generate a pull-down reference voltage VREF_SAN corresponding to the current temperature information TEMP_C based on the second high-temperature reference voltage H_VREFN and the second low-temperature reference voltage C_VREFN. The second reference voltage regulator 531 may include a plurality of resistors coupled in series between the second high-temperature reference voltage H_VREFN and the second low-temperature reference voltage C_VREFN, and may select one of the plurality of resistors according to the current temperature information TEMP_C to output the pull-down reference voltage VREF_SAN. Since the second reference voltage regulator 531 has substantially the same configuration as the first reference voltage regulator 511, a detailed description thereof will be omitted.

The second voltage generator 533 may generate the pull-down voltage VSAN based on the pull-down reference voltage VREF_SAN. The second voltage generator 533 may be implemented with a low drop-out (LDO) regulator.

For example, the second voltage generator 533 may include a third comparator C3, a second drive driver D2, and first and second active resistors AR1 and AR2. The third comparator C3 may receive the pull-down reference voltage VREF_SAN at a negative (−) input terminal, a third feedback voltage VFB3 at a positive (+) input terminal, and compare them to output a second driving control signal DS2. The third comparator C3 may generate the second driving control signal DS2 that transitions to a logic low level when the third feedback voltage VFB3 is lower than the pull-down reference voltage VREF_SAN. The second driver D2 may drive a pull-down voltage (VSAN) terminal with an external source voltage VEXT according to the second driving control signal DS2. The second driver D2 may be implemented with a PMOS transistor that receives the second driving control signal DS2 as a gate. The first and second active resistors AR1 and AR2 may be coupled in series between the pull-down voltage (VSAN) terminal and the ground voltage (VSS) terminal. The third feedback voltage VFB3 may be output from a common node of the first and second active resistors AR1 and AR2. The first and second active resistors AR1 and AR2 may be implemented with an NMOS transistor in which a gate and a drain are diode-connected, respectively, and may have first and second resistance values. The third feedback voltage VFB3 may have a voltage level determined according to a resistance ratio of the first resistance value and the second resistance value.

With the above configuration, the second voltage generator 533 may generate the pull-down voltage VSAN by regulating the external source voltage VEXT according to the pull-down reference voltage VREF_SAN.

Figure 11:
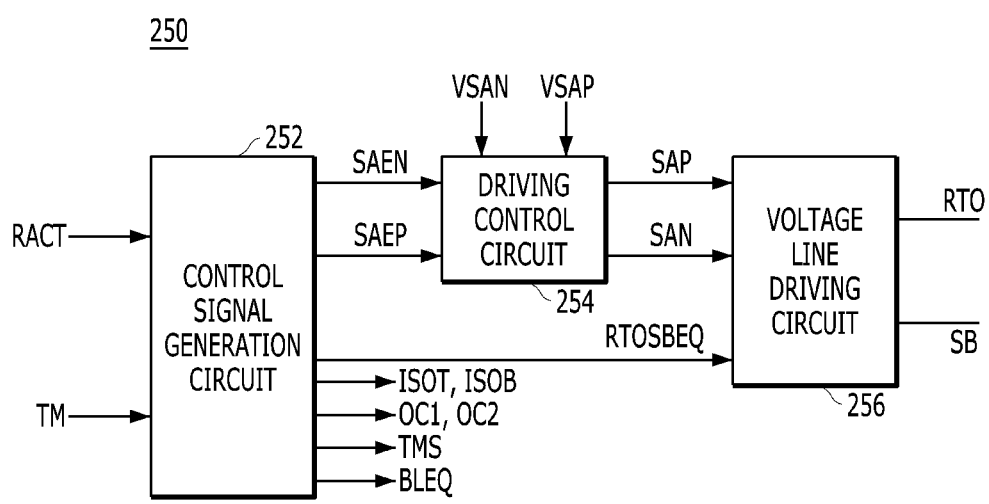
FIG. 11 is a detailed block diagram illustrating a sensing control circuit of FIG. 2.
Figure 12:
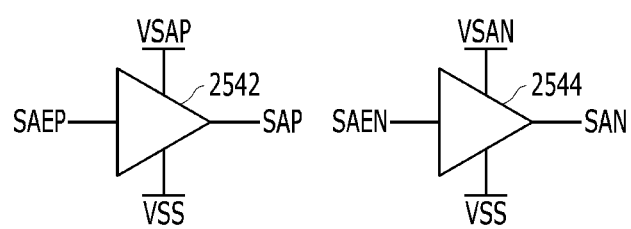
FIG. 12 is a circuit diagram illustrating a driving control circuit of FIG. 11.
Figure 13:
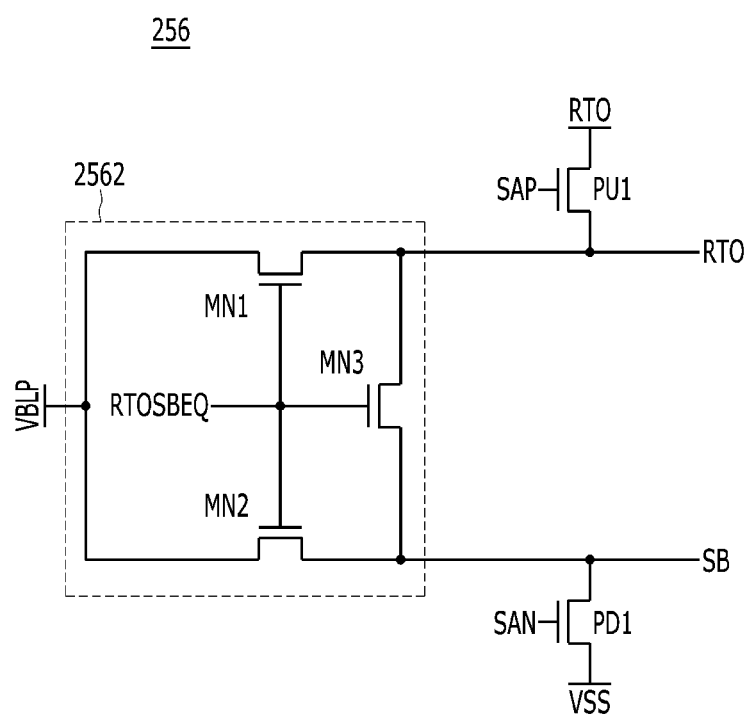
FIG. 13 is a circuit diagram illustrating a voltage line driving circuit of FIG. 11.

FIG. 11 is a detailed block diagram illustrating the sensing control circuit 250 of FIG. 2. FIG. 12 is a circuit diagram illustrating a driving control circuit 254 of FIG. 11. FIG. 13 is a circuit diagram illustrating a voltage line driving circuit 256 of FIG. 11.

Referring to FIG. 11, the sense amplifier control circuit 250 may include a control signal generation circuit 252, a driving control circuit 254, and a voltage line driving circuit 256.

The control signal generation circuit 252 may generate the first offset cancellation signal OC1, the second offset cancellation signal OC2, the first isolation signal ISOT, the second isolation signal ISOB, the test pulse TMS, and the bit line precharge signal BLEQ, according to the row active signal RACT or the test mode signal TM. The control signal generation circuit 252 may additionally generate a first sense amplifier enable signal SAEP, a second sense amplifier enable signal SAEN, and an equalization signal RTOSBEQ, according to the row active signal RACT or the test mode signal TM.

The drive control circuit 254 may output the pull-up voltage VSAP as a pull-up control signal SAP in response to the first sense amplifier enable signal SAEP, and output the pull-down voltage VSAN as a pull-down control signal SAN in response to the second sense amplifier enable signal SAEN. Referring to FIG. 12, the driving control circuit 254 may include a first sensing driver 2542 and a second sensing driver 2544. The first sensing driver 2542 may receive the pull-up voltage VSAP and the ground voltage VSS as operating voltages operate, and drive the pull-up control signal SAP with the first sense amplifier enable signal SAEP. The second sensing driver 2544 may receive the pull-down voltage VSAN and the ground voltage VSS as operating voltages, and drive the pull-down control signal SAN with the second sense amplifier enable signal SAEN.

The voltage line driving circuit 256 may drive the pull-up voltage line RTO and the pull-down voltage line SB with the precharge voltage VBLP according to the equalization signal RTOSBEQ. The voltage line driving circuit 256 may drive the pull-up voltage line RTO with the core voltage VCORE according to the pull-up control signal SAP, and drive the pull-down voltage line SB with the ground voltage VSS according to the pull-down control signal SAN. The core voltage VCORE may have a lower level than the supply voltage VDD.

Referring to FIG. 13, the voltage line driving circuit 256 may include a precharge circuit 2562, a pull-up driver PU1, and a pull-down driver PD1. The precharge circuit 2562 may apply the precharge voltage VBLP to the pull-up voltage line RTO and the pull-down voltage line SB in response to the equalization signal RTOSBEQ. The precharge circuit 2562 may include first to third NMOS transistors MN1 to MN3. The pull-up driver PU1 may provide the core voltage VCORE to the pull-up voltage line RTO in response to the pull-up control signal SAP, and the pull-down driver PD1 may provide the ground voltage VSS to the pull-down voltage line SB in response to the pull-down control signal SAN. Each of the pull-up driver PU1 and the pull-down driver PD1 may be implemented as an NMOS transistor.

As described above, in accordance with an embodiment of the present invention, a minimum value for the high temperature may be calculated by comparing the high-temperature counting values H_FBC with one another, the values H_FBC being collected through the high-temperature test operation, and a minimum value for the low temperature may be calculated by comparing the low-temperature counting values C_FBC with one another, the values C_FBC being collected through a low-temperature test operation, thereby generating the minimum error codes H_MIN_C and C_MIN_C for the respective high and low temperatures. In particular, the pull-up voltage VSAP and the pull-down voltage VSAN corresponding to the current temperature information C_TEMP may be independently generated within the range set by the minimum error codes H_MIN_C and C_MIN_C for the respective high and low temperatures. Accordingly, by reflecting defects caused by process skew, such as PMOS/NMOS transistors by temperature, leakage of cell capacitors, interference between memory cells, and poor test patterns, the pull-up voltage VSAP and the pull-down voltage VSAN may be optimized for each chip.

For example, when the PMOS transistors 311 and 321 of the sense amplifying circuit 130 have 'F' characteristics, and the NMOS transistors 312 and 322 of the sense amplifying circuit 130 have 'S' characteristics due to the process skew, the sense amplifying control circuit 170 may generate the pull-up voltage VSAP and the pull-down voltage VSAN to weaken the drivability of the pull-up driver PU1 while enhancing the drivability of the pull-down driver PD1 according to the minimum error codes H_MIN_C and C_MIN_C for respective temperatures. Accordingly, the memory device may achieve the performance of the 'TT' condition.

For example, when the PMOS transistors 311 and 321 have 'F' characteristics, and the NMOS transistors 312 and 322 have 'F' characteristics due to the process skew, the sense amplifying control circuit 170 may generate the pull-up voltage VSAP and the pull-down voltage VSAN to weaken the drivability of the pull-up driver PU1 while weakening the drivability of the pull-down driver PD1 according to the minimum error codes H_MIN_C and C_MIN_C for respective temperatures. Accordingly, the memory device may achieve the performance of the 'TT' condition.

For example, when the PMOS transistors 311 and 321 of the sense amplifying circuit 130 have 'S' characteristics, and the NMOS transistors 312 and 322 of the sense amplifying circuit 130 have 'S' characteristics due to the process skew, the sense amplifying control circuit 170 may generate the pull-up voltage VSAP and the pull-down voltage VSAN to enhance the drivability of the pull-up driver PU1 while enhancing the drivability of the pull-down driver PD1 according to the minimum error codes H_MIN_C and C_MIN_C for respective temperatures. Accordingly, the memory device may achieve the performance of the 'TT' condition.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device, comprising:
a sense amplifying circuit coupled between a pull-up voltage line and a pull-down voltage line and configured to sense and amplify data of bit lines according to a sensing control signal;
a fail detection circuit configured to calculate counting values of fail bits for each temperature based on the data and configured to generate a minimum error code for each temperature by detecting a minimum value for each temperature from the counting values for each temperature, in response to a test mode signal; and
a sense amplifying control circuit configured to drive the pull-up voltage line and the pull-down voltage line by generating a pull-up voltage and a pull-down voltage corresponding to current temperature information based on the minimum error code for each temperature and configured to generate the sensing control signal according to the test mode signal.

2. The memory device of claim 1, wherein the sense amplifying control circuit is configured to generate the sensing control signal to apply a test write voltage to the bit lines according to the test mode signal.

3. The memory device of claim 1,
wherein the minimum error code for each temperature includes a first minimum error code for a high temperature and a second minimum error code for a low temperature, and
wherein the fail detection circuit is configured to:
generate the first minimum error code by calculating the counting values for the high temperature and detecting the minimum value for the high temperature during a high-temperature test operation, and
generate the second minimum error code by calculating the counting values for the low temperature and detecting the minimum value for the low temperature during a low-temperature test operation.

4. The memory device of claim 3, wherein the sense amplifying control circuit is configured to generate the pull-up voltage and the pull-down voltage corresponding to the current temperature information in a voltage range defined by the first minimum error code and the second minimum error code.

5. The memory device of claim 1, wherein the fail detection circuit includes:
a fail counting circuit configured to calculate the counting values by comparing the data with a preset test pattern on a bit-by-bit basis in response to the test mode signal;
a per-temperature fail storage circuit configured to:
generate and store a plurality of code combinations by combining a pull-up code and a pull-down code,
store, as high-temperature counting values, the counting values corresponding to the respective code combinations during a high-temperature test operation, and
store, as low-temperature counting values, the counting values corresponding to the respective code combinations during a low-temperature test operation; and
an information generation circuit configured to output a first minimum error code by comparing the high-temperature counting values with one another, and a second minimum error code by comparing the low-temperature counting values with one another.

6. The memory device of claim 5,
wherein the fail detection circuit further includes a voltage code storage circuit configured to store the pull-up code corresponding to a plurality of preliminary pull-up voltages and the pull-down code corresponding to a plurality of preliminary pull-down voltages, and
wherein the preliminary pull-up voltages are set according to a voltage range of the pull-up voltage, and the preliminary pull-down voltages are set according to a voltage range of the pull-down voltage.

7. The memory device of claim 5, wherein the fail counting circuit includes:
a test pattern storage configured to store the preset test pattern;
a comparator configured to output a pass/fail signal by comparing the data with the preset test pattern on a bit-by-bit basis; and
a fail bit counter configured to count the pass/fail signal to generate the counting values.

8. The memory device of claim 5, wherein the information generation circuit is configured to:
output, as the first minimum error code, a code combination corresponding to a minimum one of the high-temperature counting values, and
output, as the second minimum error code, a code combination corresponding to a minimum one of the low-temperature counting values.

9. The memory device of claim 1,
wherein the minimum error code for each temperature includes a first minimum error code for a high temperature and a second minimum error code for a low temperature, and
wherein the sense amplifying control circuit includes:
a reference voltage generation circuit configured to:
generate first and second high-temperature reference voltages based on the first minimum error code, and
generate first and second low-temperature reference voltages based on the second minimum error code;
a voltage control circuit configured to:
generate the pull-up voltage corresponding to the current temperature information based on the first high-temperature reference voltage and the first low-temperature reference voltage, and
generate the pull-down voltage corresponding to the current temperature information based on the second high-temperature reference voltage and the second low-temperature reference voltage; and
a sensing control circuit configured to:
drive the pull-up voltage line and the pull-down voltage line respectively according to the pull-up voltage and the pull-down voltage, and
generate the sensing control signal according to the test mode signal.

10. The memory device of claim 9, wherein the voltage control circuit includes:
a first reference voltage regulator configured to generate a pull-up reference voltage corresponding to the current temperature information based on the first high-temperature reference voltage and the first low-temperature reference voltage;
a first voltage generator configured to generate the pull-up voltage based on the pull-up reference voltage;
a second reference voltage regulator configured to generate a pull-down reference voltage corresponding to the current temperature information based on the second high-temperature reference voltage and the second low-temperature reference voltage; and
a second voltage generator configured to generate the pull-down voltage based on the pull-down reference voltage.

11. The memory device of claim 10,
wherein the first reference voltage regulator includes a plurality of resistors coupled in series between the first high-temperature reference voltage and the first low-temperature reference voltage and is configured to select one of the plurality of resistors according to the current temperature information to output the pull-up reference voltage, and
wherein the second reference voltage regulator includes a plurality of resistors coupled in series between the second high-temperature reference voltage and the second low-temperature reference voltage and is configured to select one of the plurality of resistors according to the current temperature information to output the pull-down reference voltage.

12. The memory device of claim 9, wherein the sensing control circuit includes:
a control signal generation circuit configured to generate the sensing control signal according to the test mode signal;
a drive control circuit configured to output the pull-up voltage as a pull-up control signal and output the pull-down voltage as a pull-down control signal, in response to the sensing control signal; and
a voltage line driving circuit configured to drive the pull-up voltage line according to the pull-up control signal and drive the pull-down voltage line according to the pull-down control signal.

13. A memory device comprising:
a sense amplifying circuit coupled between a pull-up voltage line and a pull-down voltage line and configured to sense and amplify data of bit lines according to a sensing control signal;
a fail detection circuit configured to generate a first minimum error code based on counting values of fail bits calculated during a high-temperature test operation and generate a second minimum error code based on counting values of fail bits calculated during a low-temperature test operation;
a voltage generation circuit configured to generate a pull-up voltage and a pull-down voltage corresponding to current temperature information in a voltage range defined by the first minimum error code and the second minimum error code; and
a sensing control circuit configured to drive the pull-up voltage line and the pull-down voltage line according to the pull-up voltage and the pull-down voltage and configured to generate the sensing control signal.

14. The memory device of claim 13, wherein the sensing control circuit is configured to generate the sensing control signal to apply a test write voltage to the bit lines during the high-temperature test operation or the low-temperature test operation.

15. The memory device of claim 13, wherein the fail detection circuit includes:
a fail counting circuit configured to calculate the counting values by comparing the data with a preset test pattern on a bit-by-bit basis;
a per-temperature fail storage circuit configured to:
generate and store a plurality of code combinations by combining a pull-up code and a pull-down code,
store, as high-temperature counting values, the counting values corresponding to the respective code combinations during the high-temperature test operation, and
store, as low-temperature counting values, the counting values corresponding to the respective code combinations during the low-temperature test operation; and
an information generation circuit configured to output the first minimum error code by comparing the high-temperature counting values with one another, and the second minimum error code by comparing the low-temperature counting values with one another.

16. The memory device of claim 15,
wherein the fail detection circuit further includes a voltage code storage circuit configured to store the pull-up code corresponding to a plurality of preliminary pull-up voltages and the pull-down code corresponding to a plurality of preliminary pull-down voltages, and
wherein the preliminary pull-up voltages are set according to a voltage range of the pull-up voltage, and the preliminary pull-down voltages are set according to a voltage range of the pull-down voltage.

17. The memory device of claim 13, wherein the voltage generation circuit includes:
  a reference voltage generation circuit configured to:
    generate first and second high-temperature reference voltages based on the first minimum error code, and
    generate first and second low-temperature reference voltages based on the second minimum error code;
  a pull-up voltage control circuit configured to:
    generate a pull-up reference voltage corresponding to the current temperature information based on the first high-temperature reference voltage and the first low-temperature reference voltage, and
    generate the pull-up voltage using the pull-up reference voltage; and
  a pull-down voltage control circuit configured to:
    generate a pull-down reference voltage corresponding to the current temperature information based on the second high-temperature reference voltage and the second low-temperature reference voltage, and
    generate the pull-down voltage using the pull-down reference voltage.

18. The memory device of claim 17,
  wherein the pull-up voltage control circuit includes a plurality of resistors coupled in series between the first high-temperature reference voltage and the first low-temperature reference voltage and is configured to select one of the plurality of resistors according to the current temperature information to output the pull-up reference voltage, and
  wherein the pull-down voltage control circuit includes a plurality of resistors coupled in series between the second high-temperature reference voltage and the second low-temperature reference voltage and is configured to select one of the plurality of resistors according to the current temperature information to output the pull-down reference voltage.

19. A memory device comprising:
  a pair of bit lines coupled to respective columns of memory cells;
  a bit line sense amplifier (BLSA) operable, in an operation mode, according to operational pull-up and pull-down voltages and configured to sense and amplify data of the columns through the pair; and
  a control circuit configured to:
    determine the operational pull-up voltage, which corresponds to a current temperature of the memory device, based on a first linear temperature-voltage function determined by predetermined high and low temperatures of the memory device and high-temperature and low-temperature pull-up voltages, and
    determine the operational pull-down voltage, which corresponds to the current temperature, based on a second linear temperature-voltage function determined by the high and low temperatures and high-temperature and low-temperature pull-down voltage,
  wherein the high-temperature pull-up and pull-down voltages are predetermined pull-up and pull-down voltages, with which a minimum number of errors are detected from data read from the columns through an operation of the BLSA at the high temperature, and
  wherein the low-temperature pull-up and pull-down voltages are predetermined pull-up and pull-down voltages, with which a minimum number of errors are detected from data read from the columns through an operation of the BLSA at the low temperature.

* * * * *